United States Patent
Takeyama et al.

(10) Patent No.: US 8,026,538 B2
(45) Date of Patent: Sep. 27, 2011

(54) PHOTO-DETECTING APPARATUS AND PHOTO-DETECTING METHOD

(75) Inventors: Tomoaki Takeyama, Kawasaki (JP); Keiko Sasaki, Kawasaki (JP); Shinichirou Muro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 430 days.

(21) Appl. No.: 12/285,232

(22) Filed: Sep. 30, 2008

(65) Prior Publication Data

US 2009/0206437 A1   Aug. 20, 2009

(30) Foreign Application Priority Data

Feb. 19, 2008   (JP) ................................ 2008-037990

(51) Int. Cl.
*H01S 3/04* (2006.01)
(52) U.S. Cl. ................. 257/233; 257/E31.115; 345/207
(58) Field of Classification Search .................. 345/207; 257/E31.115, 233
See application file for complete search history.

(56) References Cited

U.S. PATENT DOCUMENTS

| | | | | |
|---|---|---|---|---|
| 4,839,735 A | * | 6/1989 | Kyomasu et al. | 348/297 |
| 5,194,727 A | * | 3/1993 | Johnson et al. | 250/214 R |
| 2003/0150979 A1 | * | 8/2003 | Lauffenburger et al. | 250/214 R |
| 2006/0146324 A1 | * | 7/2006 | Klein | 356/302 |
| 2006/0285563 A1 | * | 12/2006 | Hakomori | 372/38.01 |
| 2009/0194674 A1 | * | 8/2009 | Shih | 250/214 R |

FOREIGN PATENT DOCUMENTS

| | | |
|---|---|---|
| JP | 8-181348 | 7/1996 |
| JP | 8-278110 | 10/1996 |
| JP | 3276306 | 2/2002 |
| JP | 3700575 | 7/2005 |

* cited by examiner

*Primary Examiner* — Eugene Lee
(74) *Attorney, Agent, or Firm* — Staas & Halsey LLP

(57) ABSTRACT

A photo-detecting apparatus includes a photodiode that coverts light into electricity, a reverse-voltage switching unit that switches a reverse voltage to be applied to the photodiode, a current-difference detecting unit that detects a change in an output current of the photodiode occurring due to switching of the reverse voltage as a current difference, a correspondence retaining unit that retains a correspondence between the current difference and a dark current, a dark-current calculating unit that calculates a dark current by referring to the correspondence based on the current difference detected by the current-difference detecting unit, and a dark-current correcting unit that corrects the output current of the photodiode based on the dark current to find a photocurrent obtained through photoelectric conversion.

3 Claims, 4 Drawing Sheets

PHOTO-DETECTING APPARATUS AND PHOTO-DETECTING METHOD

BACKGROUND OF THE INVENTION

1. Field of the Invention

The present invention relates to photo-detecting apparatuses and photo-detecting methods using a photodiode and, in particular, to a photo-detecting apparatus and photo-detecting method for detecting the intensity of weak light with high accuracy.

2. Description of the Related Art

In recent years, with the progress of multimedia networks, demands for communication traffics have been dramatically increasing. For this reason, Wavelength Division Multiplexing (WDM) transmission systems for multi-step relay amplification of optical signals by using an optical amplifier serve an important role in economizing communication systems in multimedia society.

A transmission distance assumed in a WDM transmission system tends to be increased with technical advances of WDM transmission systems, and currently is on the order of 35 decibels at maximum. This means that, for example, an input power of an optical amplifier is extremely small, such as −34 decibels with reference to one milliwatt [dBm] even when an output from its upstream optical amplifier is 1 decibel with reference to one milliwatt.

As depicted in FIG. 7, an optical amplifier 1 generally senses an input power and, with that power, a gain of an Er-doped fiber (EDF) incorporated in the optical amplifier 1 or an attenuation of a Variable Optical Attenuator (VOA) 3 is determined. Therefore, even a small optical power is required to be detected with high accuracy of ±0.1 decibel [dB].

As for branch ratio of an optical demultiplexer 2 depicted in FIG. 2, the influence of a dark current of the photodiode can be more reduced as more power is branched to a photo-detecting apparatus 10 side. Then, however, the light power of a main signal system is decreased, and an optical signal-to-noise ratio (OSNR) after amplification by the optical amplifier 1 is significantly degraded. For this reason, an optical demultiplexer with a branch ratio on the order of 13 decibels down has to be used. At this time, the light-receiving power of the photo-detecting apparatus is extremely small, −47 decibels referred to one milliwatt, which is within a range where the influence of the dark current is not negligible.

If a dark current included in the current to be detected by the photodiode is identified and only that dark current can be corrected, even a small light power can be detected with high accuracy. However, the range of environmental temperature where the optical amplifier is placed is from 0 degree Celsius to 65 degrees Celsius, and is arbitrarily changed depending on the difference in temperature between day and night in one day or the season. The dark current has an extremely high temperature-dependency, and is changed approximately ten folds as the temperature increases within the temperature range. Thus, correction has to be made also in consideration of such temperature characteristics of the dark current.

To simply know an instantaneous dark current, several methods are known, such as a method of temporarily interrupting light power entering the photodiode to measure a dark current and then correcting its amount (refer to Japanese Patent Application Laid-open Publication No. H08-278110, for example) and a method of correcting a dark current by using an auxiliary light-receiving element that generates only a dark current that depends on an ambient temperature with incident light being interrupted (refer to Japanese Patent Application Laid-open Publication No. H08-181348, for example).

However, since it is required to guarantee that the optical amplifier always operates at a predetermined output level in an optical transmission system, the input power is required to be constantly monitored. For this reason, the method of interrupting incident light to directly measure the dark current cannot be applied to the photo-detecting apparatus of the optical amplifier in the optical transmission system.

Moreover, in the method of using an auxiliary light-receiving element, a problem arises such that cost is increased due to the addition of a photodiode. Similarly, also in a method of preparing a thermometer and calculating and correcting a dark current from a relational expression of a dark current to temperature characteristics prepared in advance, a problem arises such that cost is increased due to the addition of a thermometer.

Thus, a challenge is to accurately correct a dark current without increasing cost while always accurately monitoring light power even when a change in environment temperature is abruptly changed.

SUMMARY

It is an object of the present invention to at least partially solve the problems in the conventional technology.

A photo-detecting apparatus according to one aspect of the present invention includes a photodiode that coverts light into electricity, a reverse-voltage switching unit that switches a reverse voltage to be applied to the photodiode, a current-difference detecting unit that detects a change in an output current of the photodiode occurring due to switching of the reverse voltage as a current difference, a correspondence retaining unit that retains a correspondence between the current difference and a dark current, a dark-current calculating unit that calculates a dark current by referring to the correspondence based on the current difference detected by the current-difference detecting unit, and a dark-current correcting unit that corrects the output current of the photodiode based on the dark current to find a photocurrent obtained through photoelectric conversion.

A photo-detecting method according to another aspect of the present invention is for detecting light based on an output current of a photodiode which converts light into electricity, and includes switching a reserves voltage to be applied to the photodiode, detecting a change in an output current of the photodiode occurring due to switching of the reverse voltage as a current difference, calculating a dark current by referring to a correspondence between the current difference and a dark current based on the current difference detected in the detecting, and correcting the output current of the photodiode based on the dark current to find a photocurrent obtained through photoelectric conversion.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

Embodiments of a photo-detecting apparatus and a photo-detecting method according to the present invention are explained in detail below with reference to the drawings.

Figure 1:
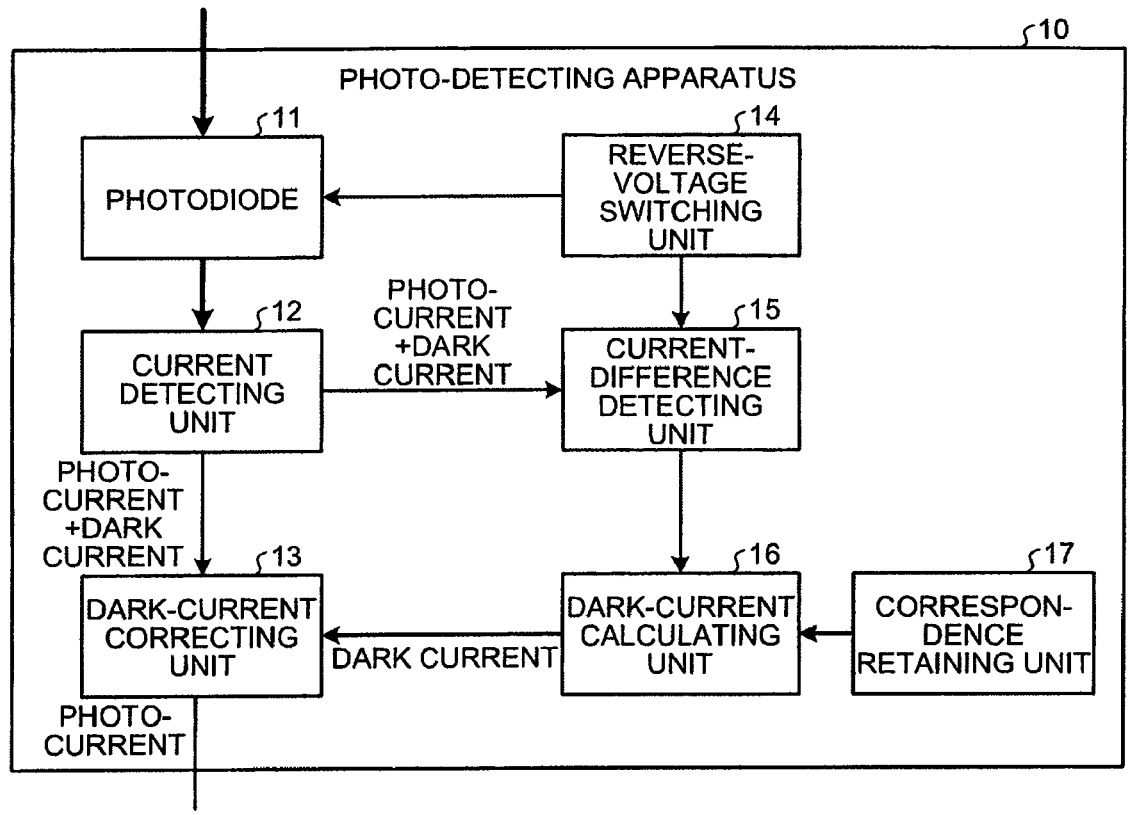
FIG. 1 is a schematic block diagram of a photo-detecting apparatus according to an embodiment of the present invention.

FIG. 1 is a schematic block diagram of a photo-detecting apparatus according to an embodiment of the present invention. As shown in FIG. 1, a photo-detecting apparatus 10 according to the present embodiment includes a photodiode 11, a current detecting unit 12, a dark-current correcting unit 13, a reverse-voltage switching unit 14, a current-difference detecting unit 15, a dark-current calculating unit 16, and a correspondence retaining unit 17.

The photodiode 11 is a photoelectric converting element that converts light into electricity, whilst the current detecting unit 12 is a circuit that detects an output current of the photodiode 11. The reverse-voltage switching unit 14 is a circuit that switches a reverse voltage (reverse bias) of the photodiode 11.

The current-difference detecting unit 15 is a circuit that detects an amount of change in current detected by the current detecting unit 12, the change due to switching of the reverse voltage by the reverse-voltage switching unit 14.

The correspondence retaining unit 17 is a storage unit that retains a correspondence between the dark current and the current difference occurring through switching of the reverse voltage. The dark-current calculating unit 16 calculates a dark current by using the current difference detected by the current-difference detecting unit 15 and the correspondence explained above.

Since the value obtained through detection by the current detecting unit 12 is a total of a photocurrent occurring correspondingly to the intensity of light received by the photodiode 11 and a dark current occurring irrespectively of a light-receiving state, the dark-current correcting unit 13 corrects a dark-current component by subtracting the value calculated by the dark-current calculating unit 16 from the value obtained through detection by the current detecting unit 12, and then outputs the photocurrent detection result.

Figure 2:
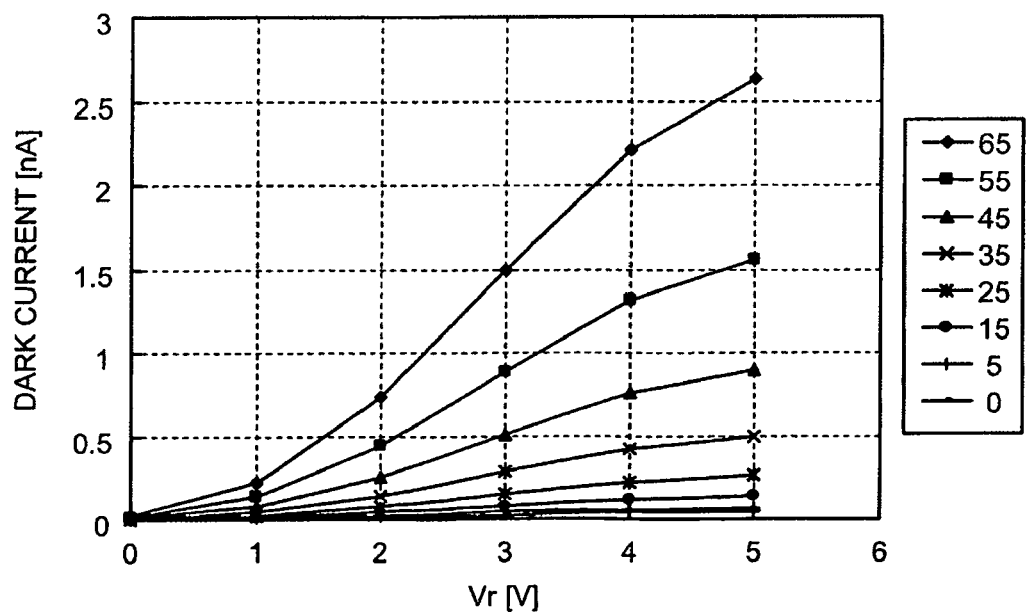
FIG. 2 is a graph for explaining reverse-bias dependency of a dark current.

That is, the present invention uses a fact that the dark current of the photodiode has temperature dependency as well as reverse-voltage dependency as depicted in FIG. 2. The dark current has a property of increasing as the reverse voltage and the temperature increase.

Figure 3:
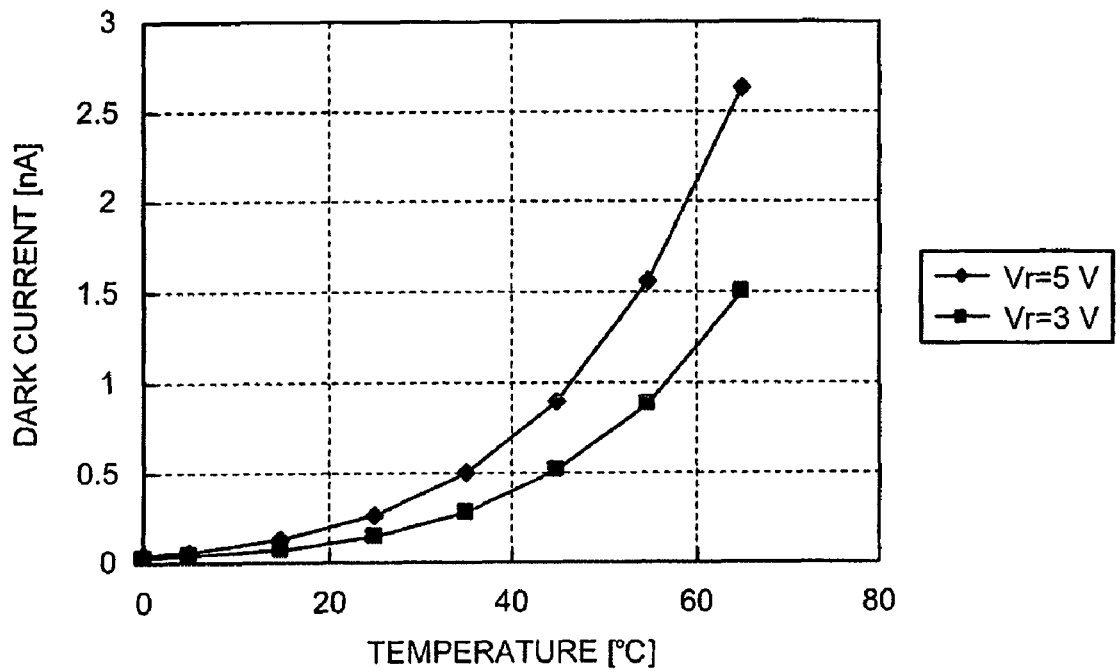
FIG. 3 is a graph for explaining temperature dependency of the dark current.

Here, consider switching of a voltage for driving a reverse voltage. For example, when switching is made between a reverse voltage of 5 volts and a reverse voltage of 3 volts, characteristics can be observed as depicted in FIG. 3. Furthermore, when a difference in dark current at the time of reverse-voltage switching is focused, it can be found that the dark current increases as the temperature increases, and the difference in dark current at the time of reverse-voltage switching also increases as the temperature increases.

Figure 4:
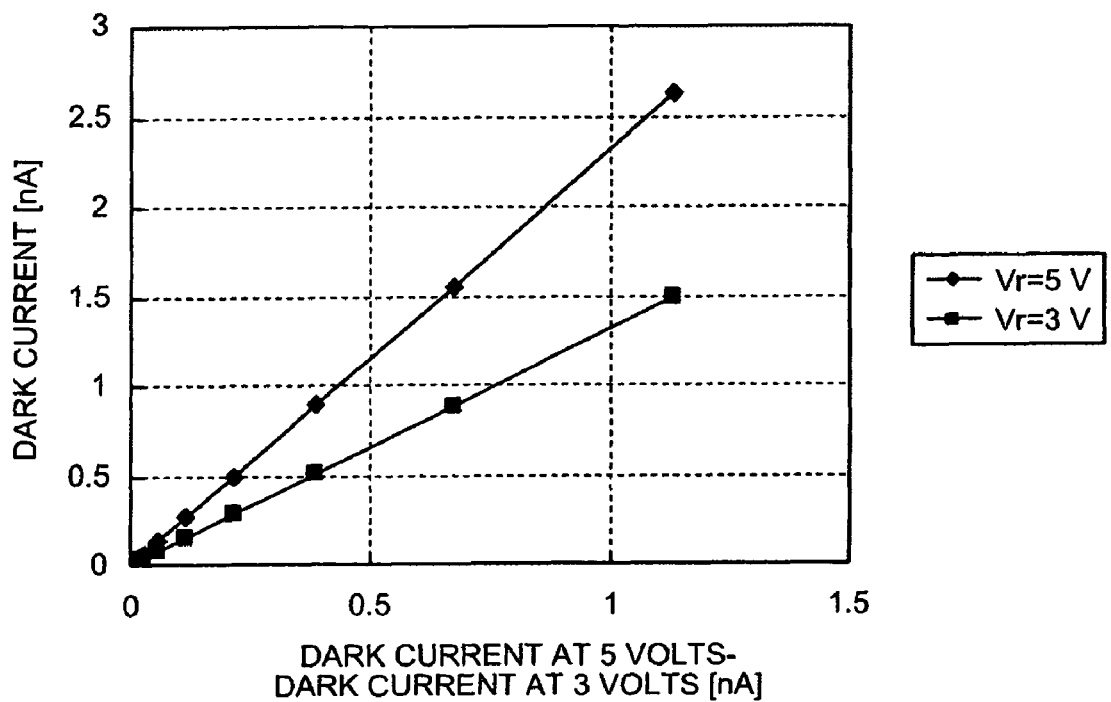
FIG. 4 is a graph for explaining a correspondence between the dark current value and a difference in dark current at the time of reverse-voltage switching.

A relation between the dark current and the difference in dark current at the time of reverse-voltage switching is depicted in FIG. 4. It can be found that an absolute value of the dark current at the time can be known by switching the reverse voltage even when a change occurs in environment temperature.

Figure 5:
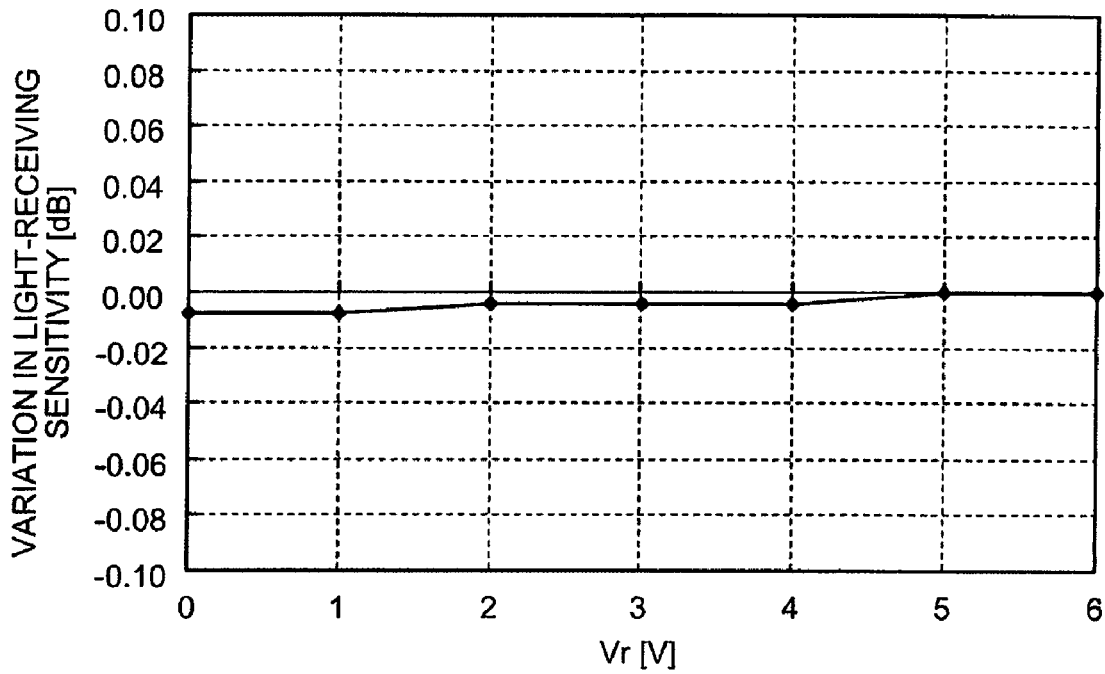
FIG. 5 is a graph for explaining reverse-bias dependency of light-receiving sensitivity.

On the other hand, efficiency of converting light power to a photocurrent, that is, reverse-voltage dependency of light-receiving sensitivity, is smaller than 0.01 decibel as depicted in FIG. 5, and therefore is negligible.

For this reason, by using such property of the photodiode, the dark current can be corrected. As depicted in FIG. 1, input light is first received by the photodiode 11, and a sum of a photocurrent and a dark current that occur is detected by the current detecting unit 12.

Next, the reverse-voltage switching unit 14 switches the reverse voltage to another reverse voltage. Then, a sum of the photocurrent and the dark current is detected in a manner similar to above, and then a difference in current at the time of reverse-voltage switching is calculated. This current difference can be considered as a difference in dark current. From a previously-prepared relational expression between the dark current and the difference in dark current due to reverse-voltage switching as depicted in FIG. 4, a dark current in each reverse voltage is calculated. Finally, the dark current is subtracted from the current initially detected, whereby a correct photocurrent is calculated.

Figure 7:
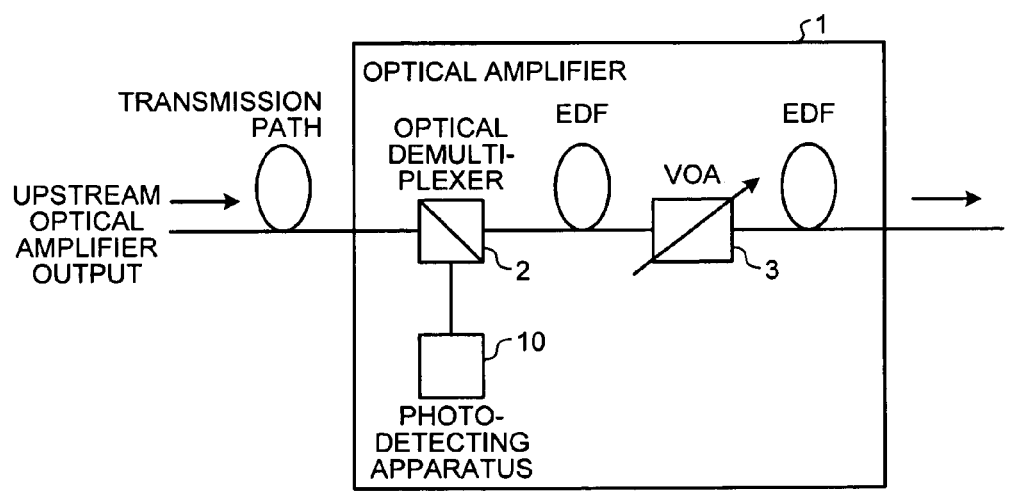
FIG. 7 is a schematic diagram for explaining a light transmitting system and an optical amplifier.

For example, consider the case where the present invention is applied to the optical amplifier 1 as depicted in FIG. 7, and the input power of the optical amplifier 1 is assumed to be −34 decibels with reference to one milliwatt. As for the branch ratio of the optical demultiplexer 2 shown in FIG. 7, the light-receiving power of the photodiode (PD), which is a photoelectric converting element, is increased as more power is branched to the photo-detecting apparatus 10 side, thereby reducing the influence of the dark current of the photodiode. Then, however, the light power of the main signal system is decreased, and an OSNR after amplification by the optical amplifier is significantly degraded. For this reason, an optical demultiplexer with a branch ratio on the order of 13 decibels down has to be used.

At this time, the light-receiving power of the photo-detecting apparatus 10 is −47 decibels referred to one milliwatt (=20 nanowatts [nW]). Here, for example, the light-receiving sensitivity of the photodiode is 1 A/W, and the photocurrent is 20 nanoamperes [nA]. By contrast, the dark current has characteristics as depicted in FIG. 2, where the dark current is 1.5 nanoamperes for a reverse voltage of 3 volts at 65 degrees Celsius. If this dark current is neglected, an input-power measurement error of 0.31 decibels occurs, exceeding a measurement accuracy of ±0.1 decibels required for the amplifier. Thus, this dark current has to be well corrected.

Figure 6:
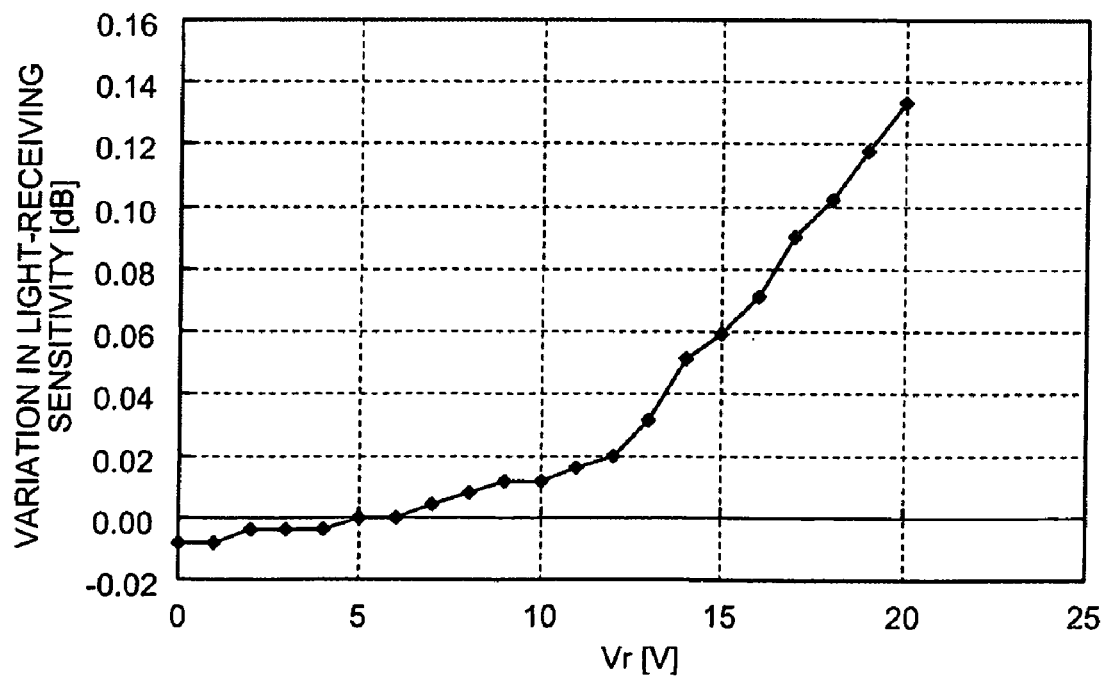
FIG. 6 is a another graph for explaining reverse-bias dependency of light-receiving sensitivity.

First, temperature dependency of a dark current in a photodiode for use when operated with reverse biases of 5 volts and 3 volts is measured in advance as depicted in FIG. 3 to obtain a relational expression. These two reverse biases have to be selected from a range with small reverse-voltage dependency of light-receiving sensitivity. As depicted in FIG. 6, reverse-voltage dependency of light-receiving sensitivity can be observed with reverse voltages larger than 12 volts, and therefore these reverse voltages cannot be used. In consideration of this, 5 volts and 3 volts are selected. Data of the obtained relational expression is then rewritten into a relational expression between a dark current and a difference between a dark current at 5 volts and a dark current at 3 volts.

In the actual circuitry configuration depicted in FIG. 1, with the reverse voltage of the photodiode 11 first being set at 3 volts and with input light of 20 nanowatts being received at the photodiode, a sum of a photocurrent and a dark current that occur detected by the current detecting unit 12 was 4.5 nanoamperes.

Then, with the reverse voltage being switched to 5 volts by the reverse-voltage switching unit 14, a sum of the photocurrent and the dark current detected was 5.6 nanoamperes. Therefore, the detection result of the current-difference detecting unit 15 is 1.1 nanoamperes.

As depicted in FIG. 5, since reverse-voltage dependency of light-receiving sensitivity is negligible at approximately 0.01 decibel, the current difference obtained above can be considered a dark-current difference. For example, if the temperature is currently at 65 degrees Celsius, a difference between a dark current at a reverse voltage of 5 volts and a dark current at a reverse voltage of 3 volts can be observed as 1.1 nanoamperes.

Upon obtainment of this current difference, from the relational expression prepared in advance between a dark current and a dark-current difference due to reverse-voltage switching of FIG. 4, a dark current at each reverse voltage is calculated. When a difference between a dark current at a reverse voltage of 5 volts and a dark current at a reverse voltage of 3 volts is currently 1.1 nanoamperes, it can be found that the dark current at a reverse voltage of 5 volts is 2.6 nanoamperes and the dark current at a reverse voltage of 3 volts is 1.5 nanoamperes. Finally, when the calculated dark current is subtracted from the sum of the photocurrent and the dark current first detected, a photocurrent with a dark current accurately corrected can be recognized.

Here, since the sum of the photocurrent and the dark current at a reverse voltage of 5 volts is 5.6 nanoamperes, the photocurrent is 3 nanoamperes. Further, since the sum of the photocurrent and the dark current at a reverse voltage of 3 volts is 4.5 nanoamperes, the photocurrent is also 3 nanoamperes.

As has been explained in the foregoing, the photo-detecting apparatus 10 according to the present embodiment switches the reverse voltage to be applied to the photodiode 11, and detects a difference in output current of the photodiode 11 occurring due to reverse-voltage switching. This differential current is converted to a dark current by referring to the correspondence between the differential current and the dark current found in advance by using reverse-voltage dependency of the dark current, and then the dark-current is subtracted from the output current of the photodiode 11 to find a photocurrent. Thus, even when there is an abrupt change in environmental temperature, the photocurrent can be accurately detected by correcting the dark current without increasing cost while always accurately monitoring light power.

Here, in the present embodiment, the characteristics are explained assuming that a PIN diode is used as the photodiode 11. When an avalanche photodiode (APD) is used, its current characteristics are same as above, and therefore the present invention can be applied to the APD. When the APD is used, however, since reverse-voltage dependency of light-receiving sensitivity is extremely large, two reverse voltages for switching have to be selected from range between 18 volts and 28 volts where the reverse voltage of light-receiving sensitivity is negligible.

Also, the configuration and operation depicted in the present embodiment are merely by way of example, and are not meant to restrict the present invention. For example, each processing unit depicted in FIG. 1 (the current detecting unit 12, the dark-current correcting unit 13, the reverse-voltage switching unit 14, the current-difference detecting unit 15, the dark-current calculating unit 16, and the correspondence retaining unit 17) may be achieved as an individual electric circuit, or all or part of these processing units may be achieved as software.

According to the present invention, effect can be achieved such that a photo-detecting apparatus and photo-detecting method which accurately detect a weak intensity of light by accurately correcting a dark current without increasing cost while always accurately monitoring light power can be provided.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A photo-detecting apparatus comprising:
   a photodiode that coverts light into electricity;
   a reverse-voltage switching unit that switches a reverse voltage to be applied to the photodiode;
   a current-difference detecting unit that detects a change in an output current of the photodiode occurring due to switching of the reverse voltage as a current difference;
   a correspondence retaining unit that retains a correspondence between the current difference and a dark current;
   a dark-current calculating unit that calculates a dark current by referring to the correspondence based on the current difference detected by the current-difference detecting unit; and
   a dark-current correcting unit that corrects the output current of the photodiode based on the dark current to find a photocurrent obtained through photoelectric conversion.

2. The photo-detecting apparatus according to claim 1, wherein
   the photodiode is a PIN photodiode.

3. The photo-detecting apparatus according to claim 1, wherein
   the reverse-voltage switching unit switches between two voltages equal to or smaller than 12 volts.

* * * * *